United States Patent [19]

Cohen et al.

[11] 4,025,881
[45] May 24, 1977

[54] MICROWAVE HARMONIC POWER CONVERSION APPARATUS

[75] Inventors: Leonard D. Cohen, Brooklyn; Erich H. Kraemer, Huntington; Shlomo Nussbaum, Massapequa, all of N.Y.

[73] Assignee: Cutler-Hammer, Inc., Milwaukee, Wis.

[22] Filed: Apr. 9, 1976

[21] Appl. No.: 675,536

[52] U.S. Cl. .................. 333/98 R; 307/320; 321/69 NL; 321/69 W; 333/33; 333/82 R
[51] Int. Cl.² ............. H01P 1/20; H01P 1/16; H03B 19/00; H02M 5/16
[58] Field of Search .......... 333/98 M, 98 R, 83 R, 333/80 R, 80 T, 33, 82 R; 307/320; 321/69 W, 69 NL; 330/4.9, 56; 331/96, 107 R, 107 G

[56] References Cited

UNITED STATES PATENTS

| | | | |
|---|---|---|---|
| 2,806,138 | 9/1957 | Hopper | 333/98 X |
| 3,702,977 | 11/1972 | Olsson | 331/96 X |
| 3,818,388 | 6/1974 | Hill et al. | 333/83 R X |

OTHER PUBLICATIONS

Southworth – "Principles and Applications of Waveguide Transmission" Van Nostrand, New York 1961; Title Page and pp. 254–255.

*Primary Examiner*—Alfred E. Smith
*Assistant Examiner*—Marvin Nussbaum
*Attorney, Agent, or Firm*—Kevin Redmond

[57] ABSTRACT

Microwave devices for power conversion between harmonically related frequencies, using an oversized cavity and antenna means to provide the required coupling to a varactor therein.

3 Claims, 3 Drawing Figures

MICROWAVE HARMONIC POWER CONVERSION APPARATUS

BACKGROUND

This invention relates to microwave devices such as frequency multipliers, of the type wherein a semiconductor varactor diode is driven by microwave power at one frequency to produce microwave power at another, harmonically related frequency.

Prior art devices generally consist of a resonant enclosure containing the varactor and provided with suitable input and output ports, impedance matching and tuning means. The enclosure frequently consists of a length of waveguide proportioned to operate in the dominant $TE_{10}$ mode at the frequencies involved. Such expedients as reduced-height waveguide sections are commonly required to facilitate matching the relatively low impedance of the varactor diode.

As the micorwave spectrum in use extends further into the millimeter wave region, the prior art structures become smaller and more difficult and expensive to fabricate. Also, because presently available millimeter wave sources are of relatively low power capability, minimization of circuit losses is important. A further and more basic power limitation is imposed by the fact that the varactor must be almost micorscopically small to operate at such frequencies, with correspondingly low power handling capability.

SUMMARY

Accordingly to this invention, a varactor diode is enclosed in a cavity that is oversized with respect to at least one of the operating frequencies, and is coupled to the electric fields within the cavity by an antenna. The oversized cavity exhibits less ohmic loss than a smaller sized dominant mode cavity, and can provide an essentially plane wave environment compatible with the operation of an array of antennas and varactors. The antenna serves also in matching the relatively high impedance of the cavity to the relatively low impedance of the varactor, thereby reducing the complexity and attendant losses of required auxiliary matching and tuning devices.

DRAWING

Figure 2:
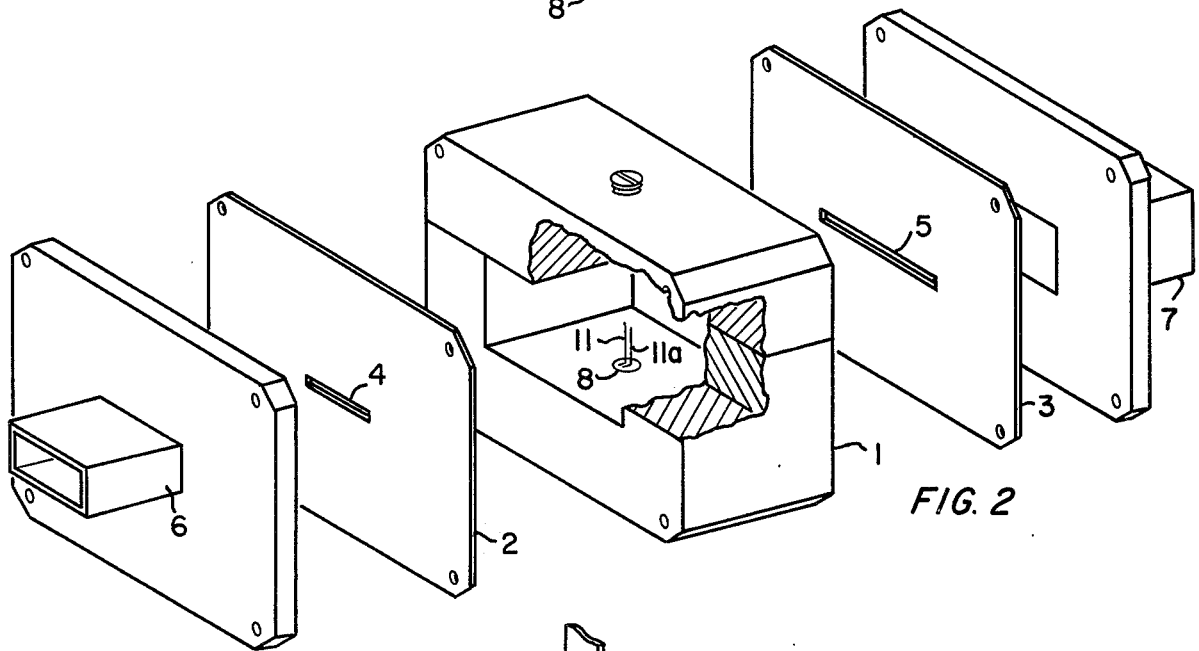
FIG. 2 is an exploded view of the structure of FIG. 1, showing internal details.
Figure 3:
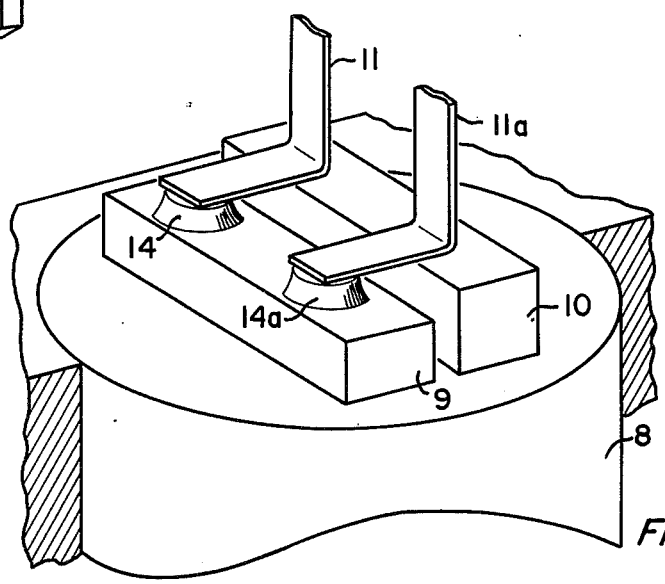

FIG. 3 an enlarged view of a portion of FIG. 2, showing further details.

DESCRIPTION

Figure 1:
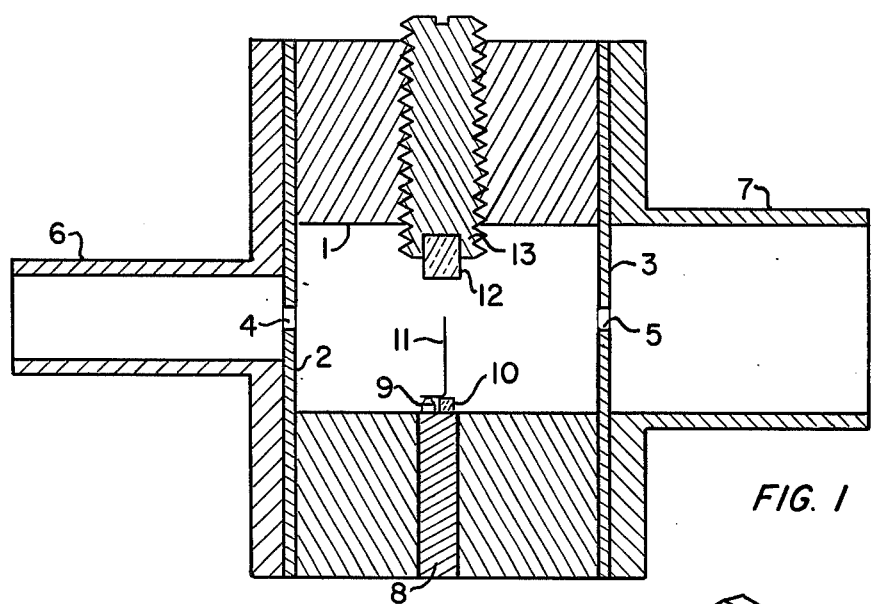
FIG. 1 is a view in longitudinal cross section of a presently preferred embodiment of the invention.

Referring to FIGS. 1 and 2, a short length of rectangular waveguide 1 is terminated at its ends by conductive walls 2 and 3 to provide an enclosed cavity. The waveguide is oversized with respect to at least one of the frequencies between which power is to be converted. The term "oversized" as used herein is intended to mean that the waveguide is large enough to support higher order modes in addition to the dominant $TE_{10}$ mode at that frequency. The term is also used with the same meaning to characterize the cavity.

Parallel resonant slots or irises 4 and 5 provide ports for coupling the cavity to external load and source means, not shown, by way of waveguides 6 and 7. Slots 4 and 5 are dimensioned to resonate at the higher and lower operating frequencies $f2$ and $f1$. The slots 4 and 5 are each disposed in transverse symmetry with respect to the axis of propagation of the waveguide 1, to avoid excitation of the higher order modes that the waveguide can support. Waveguides 6 and 7 are designed for dominant mode propagation at frequencies $f2$ and $f1$, respectively.

A conductive pin 8 extends through a hole in the bottom wall of the waveguide 1, and is retained therein and electrically connected to said wall, as by solder. Secured to the top end of the pin 8, in the plane of the inner wall surface is a varactor diode chip 9 and a stand-off insulator 10. The insulator 10 is a block of fused quartz with upper and lower surfaces metallized to enable soldering or other electrical bonding to the pin 8 and to the bottom of an antenna element 11. The antenna element 11 extends vertically into the cavity and is bent horizontally at the bottom for contact with the insulator 10 and the upper terminal of the varactor 9.

Denoting $\lambda_{g1}$ as the guide wavelength in waveguide 1 at frequency $f1$, and $\lambda_{g2}$ as that at frequency $f2$, the antenna element 11 is located at a distance $\frac{1}{4}n\lambda_{g1}$ from wall 2, and at a distance $\frac{1}{4}n'\lambda_{g2}$ from wall 3, where $n$ and $n'$ are small odd integers. A body 12 of low loss dielectric material such as quartz is supported above the top end of the antenna element 11 by means of a screw 13 threaded in the top wall of the guide 1.

An appreciation of the sizes of the parts of the described structure can be gained by considering that the diameter of pin 8 is typically about 0.025 inch.

Referring to the greatly enlarged detail view of FIG. 3, a second antenna element 11a is supported on the insulator 10 beside element 11 and extending parallel to it. The elements 11 and 11a are thin ribbons, with lower generally horizontal tabs extending to and bonded to the upper contact regions of corresponding varactor diodes 14 and 14a. As shown, these diodes are in the form of mesas side by side on the top of a single chip 9. Although two antenna elements and two diodes are illustrated, it is within the contemplation of the invention to provide only a single antenna element and a single diode if desired. In either case, the pin 8 is located centrally of the width of the waveguide, as seen in FIG. 2, to provide an electrically symmetrical environment for the desired dominant modes at frequencies $f1$ and $f2$. For higher power capability a plurality of antenna elements, or groups thereof may be used. In such cases the necessary symmetry may be achieved by locating them at $\frac{1}{2}\lambda_{g1}$ intervals transversely and/or longitudinally of the waveguide 1.

The described device is useful as a frequency multiplier for frequencies of the order of 100 GHz. In operation as such, input power at the fundamental frequency of 100 GHz, for example, is supplied to the waveguide 7 by an external source, not shown, and is admitted to the cavity through the parallel resonant port 5. Because the port 4 in wall 2 is not resonant at the fundamental frequency, the input power cannot escape through it but is reflected back toward the input side. This produces a standing wave pattern with a field intensity maximum at the plane of antenna 11.

The antenna collects power from the microwave field to produce a flow of current at the fundamental frequency $f1$ through the varactor 9. The non-linear reactance and resistance characteristics of the varactor result in the conversion of some of the power from fundamental frequency $f1$ to harmonics at $f21$, $3f1$, and so on, producing current flow in the varactor and the antenna at these frequencies.

The antenna 11 radiates harmonic power, primarily at the desired frequency $f2$. To this end, the antenna is designed in known manner to be approximately resonant at that frequency and also at the fundamental frequency $f1$. In addition to serving as a collector and radiator, the antenna performs the important function of acting as an impedance transformer. This aids in matching the relatively high impedance of the waveguide to the relatively low impedance of the varactor. The dielectric body 12 and screw 13 provide adjustable top loading for the antenna. Other conventional tuning means, not shown, may be provided in the input and output waveguides 7 and 6.

The harmonic power radiated by the antenna is admitted through the parallel resonant port 4 to the output guide 6 for transmission to a load or utilization means, not shown.

The described structure may also be used as a parametric amplifier of the non-degenerate type by supplying the signal to be amplified to waveguide 7, and a pump signal of twice the signal frequency to waveguide 6. The varactor acts as a negative resistance at the signal frequency, producing an amplified version of the input signal that flows to the right in guide 7. The input and amplified output signals are separated by an external circulator in known manner in this case.

We claim:

1. A microwave device for power conversion between harmonically related frequencies, comprising:

a. an enclosed conductive walled cavity that is oversized with respect to at least one of two frequencies between which conversion is to be effected,
   b. a varactor diode,
   c. an antenna element connected to said varactor and disposed within said cavity in dominant mode coupling relationship thereto and substantially adapted to impedance match said varactor to the cavity at said two frequencies,
   d. means defining a first port in a wall of said cavity, said means being reflective at a first of said frequencies and transmissive at a second of said frequencies,
   e. means defining a second port in a wall of said cavity, said means being reflective at said second frequency and transmissive at said first frequency, and
   f. each of said ports being symmetrical with respect to the dominant mode field pattern of said cavity.

2. The apparatus set forth in claim 1, including at least one further antenna element disposed within said cavity in dominant mode coupling relationship thereto and an associated varactor diode, the plurality of antenna elements constituting an array that is symmetrical with respect to the axis of wave propagation of the dominant mode in said cavity.

3. The invention set forth in claim 1, wherein said cavity (a) comprises a length of rectangular waveguide provided with conductive end walls, and said means (d) and (e) defining first and second ports are transverse slots in said end walls, dimensioned to be parallel resonant at said first and second frequencies respectively.

* * * * *